US011611366B2

(12) United States Patent
Pine

(10) Patent No.: US 11,611,366 B2
(45) Date of Patent: Mar. 21, 2023

(54) METHOD AND APPARATUS TO THERMALLY OPTIMIZE A PROTECTIVE CASE FOR TEMPERATURE REGULATION AND HEAT TRANSFER TO OR FROM A MOBILE DEVICE

(71) Applicant: Jerrold Scott Pine, Boca Raton, FL (US)

(72) Inventor: Jerrold Scott Pine, Boca Raton, FL (US)

(73) Assignee: Man & Machine, Landover, MD (US)

( * ) Notice: Subject to any disclaimer, the term of this patent is extended or adjusted under 35 U.S.C. 154(b) by 116 days.

(21) Appl. No.: 16/885,173

(22) Filed: May 27, 2020

(65) Prior Publication Data

US 2020/0382151 A1 Dec. 3, 2020

Related U.S. Application Data

(60) Provisional application No. 62/853,510, filed on May 28, 2019.

(51) Int. Cl.
*H04B 1/3888* (2015.01)
*H04B 1/036* (2006.01)
(Continued)

(52) U.S. Cl.
CPC ............ *H04B 1/3888* (2013.01); *A45C 11/00* (2013.01); *G06F 1/203* (2013.01); *H04B 1/036* (2013.01); *H04M 1/026* (2013.01); *H04M 1/185* (2013.01); *A45C 2011/002* (2013.01); *H05K 7/20336* (2013.01); *H05K 7/20509* (2013.01)

(58) Field of Classification Search
CPC ...... G06F 1/1632; G06F 1/203; G06F 1/1626; G06F 1/206; G06F 1/1656; G06F 2200/1633; G06F 1/1628; G06F 1/20; G06F 1/1637; G06F 1/1684; G06F 1/1698; G06F 1/1686; G06F 13/102; G06F 2200/1632; G06F 3/038; G06F 3/048; G06F 9/44505; G06F 9/453; G06F 2200/201; G06F 1/1635; G06F 1/26; G06F 1/1613; G06F 1/3215; H04B 1/3888; H04B 1/3883; H04B 5/0037; H04B 1/036; H04B 1/3877; H04M 1/0202; H04M 1/185; H04M 1/04; H04M 1/00; H04M 1/0235; H04M 1/026;
(Continued)

(56) References Cited

U.S. PATENT DOCUMENTS 10,838,462 B1 * 11/2020 Monaco .................. G06F 1/324
2016/0187927 A1 * 6/2016 MacDonald ............ G06F 1/206
361/679.41
(Continued)

FOREIGN PATENT DOCUMENTS

JP 3220696 U * 3/2019
KR 101197251 B1 * 11/2012

*Primary Examiner* — Golam Sorowar

(57) ABSTRACT

This present invention pertains to a method and apparatus to improve thermal transfer properties of a protective case for a mobile device such as a smartphone or tablet computer. The protective mobile device case is optimized for temperature regulation and heat transfer by integrating thermal interface materials into key regions of the protective case where heat transfer to or from heat sensitive components within a mobile device are located.

18 Claims, 9 Drawing Sheets

(51) Int. Cl.
  *A45C 11/00* (2006.01)
  *G06F 1/20* (2006.01)
  *H04M 1/02* (2006.01)
  *H04M 1/18* (2006.01)
  *H05K 7/20* (2006.01)

(58) Field of Classification Search
  CPC ......... H04M 1/72409; H04M 1/72412; H04M 2250/02; H04M 2250/12; H04M 1/0262
  See application file for complete search history.

(56) References Cited

U.S. PATENT DOCUMENTS

2017/0315598 A1* 11/2017 Voth ................. G06F 1/1632
2018/0253125 A1* 9/2018 Morrison ................. H05K 7/20
2018/0259401 A1* 9/2018 Polly ................. G01R 31/2874

* cited by examiner

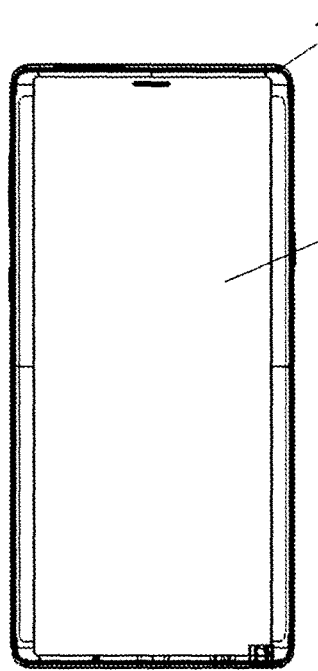
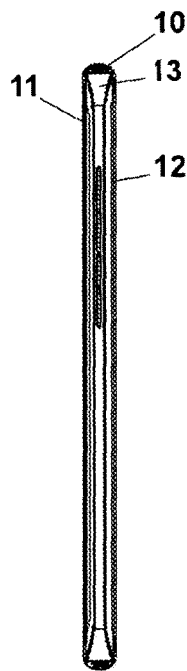
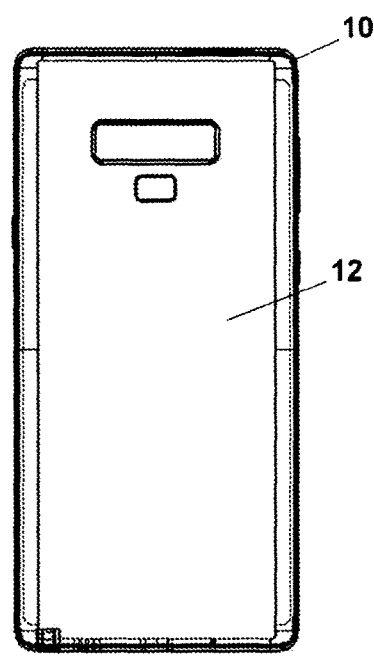
Fig. 1A  Fig. 1B  Fig. 1C
Prior Art

METHOD AND APPARATUS TO THERMALLY OPTIMIZE A PROTECTIVE CASE FOR TEMPERATURE REGULATION AND HEAT TRANSFER TO OR FROM A MOBILE DEVICE

This application claims the benefit of U.S. Provisional Application No. 62/853,510, filed May 28, 2019.

BACKGROUND OF THE INVENTION

Smartphones and tablets continue to evolve with greater processing power and graphics capabilities. Chip sets designed for mobile computing are becoming more power efficient with improvements in system architecture and advanced power management. The amount of power used by a CPU/GPU is a function of voltage, frequency and capacitance. While the system capacitance is generally fixed in the silicon design, the voltage and frequency can vary during runtime and are managed to optimize power consumption. Very high performance mobile processors like the Qualcomm Snapdragon 845 use very sophisticated dynamic clock and voltage scaling to optimize power consumption but can still demand 7 watts of power during peak demand. All of that power is dissipated in the form of heat. Mobile device mechanical designs must use systems and materials capable of dissipating this heat effectively while maintaining an aesthetic, mass and form factor suitable for mobile use. Construction of mobile devices vary significantly however a premium smartphone such as the Samsung Note 9 have the display and back surfaces made from Corning Gorilla Glass 5 and the phone's inner frame/outer-edge made from series 7000 aluminum that transfer heat efficiently.

There are several components within a mobile device that are sensitive or can even be destroyed by excessive heat or cold. The CPU/GPU chipsets and lithium ion batteries are among the components that excessive heat and cold will damage, destroy, or shorten their useful life. Temperature sensors are generally embedded within mobile devices to monitor temperatures of these components. As component temperatures rise or fall, a mobile device can throttle down CPU speeds, turn off power draining applications, or turn off the mobile device to prevent damage. For consumer use, the inconvenience of these interruptions is preferable to damaging or destroying a mobile device. However, thermal protections that impair mobile device functionality can impact that mobile device technology from being adopted for mission critical public safety use.

There are very large strategic and financial incentives to discontinue expensive trunked communication systems for public safety use and migrate to large cellular networks. The federal government has sponsored the creation of "FirstNet" using the ATT cellular infrastructure. Mobile devices are being adopted for FirstNet public safety use. Many manufacturers are creating rugged versions of mobile devices for public safety use. These rugged devices have extended operating temperature ranges and have built in mechanical features to further protect against accidental drop and shock. These rugged products meet mission critical requirements but come with a hefty price tag 2-3 times more expensive then their consumer counterparts. It would be fiscally more appropriate to supplement commercially available off the shelf mobile devices with low cost peripheral devices that enhance them so they meet mission critical requirements. The protective mobile device case for instance can be modified or redesigned to facilitate heat transfer in or out making external temperature compensation possible.

Another facet of mobile device adaptation in public safety is their ability to interface with CAD-Computer Aided Dispatch & RMS-Record Management Systems used in police and fire vehicles. Police and fire vehicles are typically deployed with rugged computing systems which typically include a mounted laptop, or mounted computer, display and keyboard with wireless modem. Prior to mobile device deployment, police would need to get back in their patrol cars during routine stops to interface with their computers to look up critical records information. Now their records management is fully mobile and mitigates the need for redundant computers in their vehicles. One important feature available on some Samsung FirstNet smartphones is called DeX which stands for desktop experience. A DeX enabled mobile device allows one to attach a display and keyboard to use the mobile device in desktop mode with a large display and keyboard for enhanced ergonomic use. The mobile device can interface to a dock in the car with display and keyboard and function as a car based system, and then be removed when on an active call. This configuration can greatly reduce the system cost, and with technology refresh cycles every three to five years, can save municipalities tens of millions of dollars going forward.

It is the intent of this invention to illustrate methods and means to take a consumer grade mobile device and use a protective mobile device case optimized for temperature regulation and to couple them to vehicle docks capable of maintaining mobile device operating temperatures when exposed to extreme high or low temperatures seasonally.

SUMMARY OF THE INVENTION

What is needed is a methodology to facilitate optimization of mobile device thermal dispersion through a mechanically protective case.

What is further needed is to provide optimal thermal conductivity between a mobile device, protective case, and a vehicle dock.

What is further needed is to provide a means to regulate a mobile device's temperature using peltier heating and cooling in a mobile dock.

What is further needed is to provide a means to control heating and cooling in the mobile dock by polling the mobile devices internal temperature sensors.

What is further needed is to provide a pogo pin electrical interface between the mobile device protective case and the vehicle dock to facilitate high number of engagement cycles.

BRIEF DESCRIPTION OF THE DRAWINGS

The present invention will become more fully understood from the detailed description given hereinbelow and the accompanying drawings which are given by way of illustration only, and thus are not limitive of the present invention, and wherein:

FIG. 1A is a front, 1B is a side, 1C is a rear view of a common mobile device, while in use, according to the prior art.

DETAILED DESCRIPTION OF THE PREFERRED EMBODIMENTS

Figure 2:
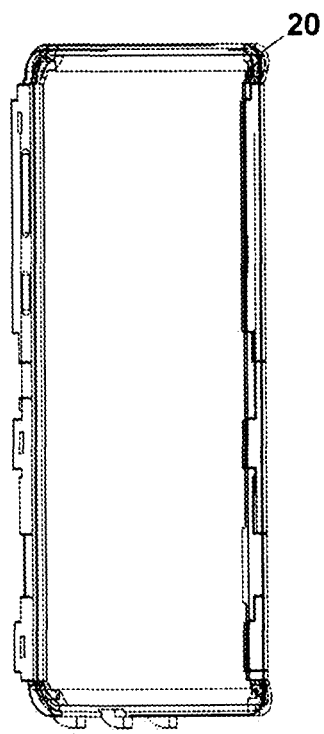
FIG. 2 is a perspective view of the front half of the hard inner case for the mobile device, while in use, according to the prior art.

Referring to FIGS. 1A, 1B, and 1C, the front, side, and back of a mobile device 10 is illustrated. A mobile device 10, which can be any type of smartphone, tablet computer, or other mobile computing device, that is illustrated here as the Note 9 Smartphone Manufactured by Samsung headquartered in Seoul, South Korea and is representative of several smartphone or tablet computers capable of an alternate desktop mode they call DeX. Desktop mode is where the CPU/GPU of the mobile device 10 can be integrated wirelessly or over USB type C cable with one or more monitors and a keyboard and touchpad/mouse/touchscreen to function as a desktop computer that overcomes the limitations of the mobile device's small screen and tiny user interface. It can be appreciated that desktop mode is representative of many solutions such as Vysor or Apowermirror that can cast or duplicate a desktop experience from a mobile device 10 whether over USB, Wi-Fi, or Bluetooth.

The mobile device 10 exterior housing as illustrated here comprises three primary surfaces, a front surface 11 made from Gorilla Glass five, a back surface 12 also made from Gorilla Glass five and the side perimeter of the mobile device 10 made from series 7000 aluminum. Gorilla Glass five is manufactured by Corning Inc. of Corning, N.Y. and is made from chemically strengthened alkali-aluminosilicate and has a Vickers hardness rating of 701. Series 7000 Aluminum is an aluminum alloy made with Aluminum, Zinc, Magnesium and Copper and has a Vickers hardness rating of 199. These materials are very hard and durable to resist mechanical shock, brakeage and aesthetic scratching. An equally important characteristic of these materials is the thermal dissipation of the heat generated by the electronics within the mobile device 10 and by cyclic battery charging and discharging. Many components that dissipate heat within the mobile device 10 are coupled internally through heat sinks, heat pipes, and thermally conductive materials to the external surfaces that conduct heat into the air or any surface the mobile device 10 contacts. The amount of heat transferred is defined by the thermal conductivity of the specific material which is defined as the amount of heat per unit time per unit area that can be conducted through a plate of unit thickness of a given material, the faces of the plate differing by one unit of temperature. It is measured in watts per degree Kelvin. The thermal conductivity of series 7000 aluminum is 154 W/(m K). The thermal conductivity of Gorilla Glass five is 1.2 W/(m K). While the thermal conductivity of series 7000 aluminum is 100× greater then the thermal conductivity of Gorilla Glass five it should be noted that the Gorilla glass five heat conduction path is only 0.4 mm thick and the series 7000 aluminum conducts heat all the way from internal heat pipes and the internal battery over centimeters of distance to the exterior surface. The net effect is that heat is transferred in various amounts across the entire external surface of the mobile device 10.

Figure 3:
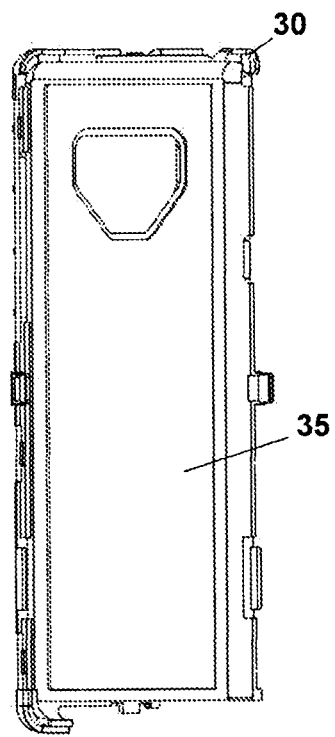
FIG. 3 is a perspective view of the back half of the hard inner case for the mobile device, while in use, according to prior art.
Figure 4:
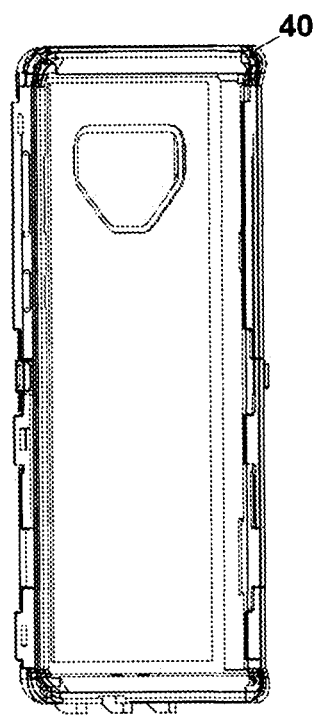
FIG. 4 is a perspective view of the front half of the hard inner case coupled to the back half of the hard inner case for the mobile device, while in use, according to the prior art.

Referring to FIGS. 2, 3, and 4 the front half of hard inner case 20, back half of hard inner case 30 and combined assembly form hard inner case 40. While the construction of the mobile device 10 protects it from many falls up to 1.6 meters on to rough surfaces, many users choose to further protect the mobile device 10 from accidental damage. One such way is to add a protective case that detachably attaches around the mobile device 10 composed of various constructions as illustrated in FIGS. 2-7. The phone case illustrated here is an Otterbox Defender made by Otterbox of Fort Collins, Colo. The front half inner of hard inner case 20 and the back half of hard inner case 30 are made of hard impact resistant polycarbonate and snap together sandwiching the mobile device 10. Attached to the back half of hard inner case 30 situated between the back half of hard inner case 30 and mobile device 10 when assembled is foam liner 35 that is constructed from open celled polypropylene and is approximately 0.040 inches thick. The thermal conductivity of polycarbonate is 0.19 W/(m K) and the thermal conductivity of open cell polypropylene is 0.20 W/(m K). Both of these materials are approximately 10% thermally conductive as Gorilla Glass five and therefore act as thermal insulators relative to the mobile device 10.

Figure 5:
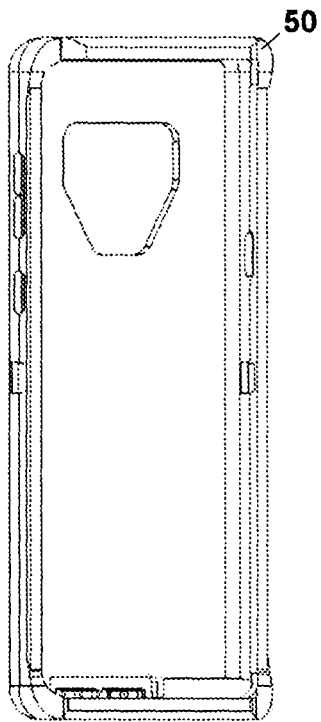
FIG. 5 is a perspective view of the soft outer case for the mobile device, while it is in use, according to the prior art.

Referring to FIG. 5, which is the soft outer case 50. The stated intention of the soft outer case 50 from manufacturers such as Otterbox is to provide environmental protection from liquid and dust intrusion and additional shock protection. Soft outer case 50 can be made from a TPE (Thermo-Plastic Elastomer), Silicone, or Polyurethane material and appears to be proprietary among manufacturers. The thermal conductivity of these materials varies significantly so a direct conclusion as to whether the thermal conductivity of the soft outer case 50 further insulates the mobile device 10 from heat transfer is difficult to discern from publicly available IP.

Figure 6:
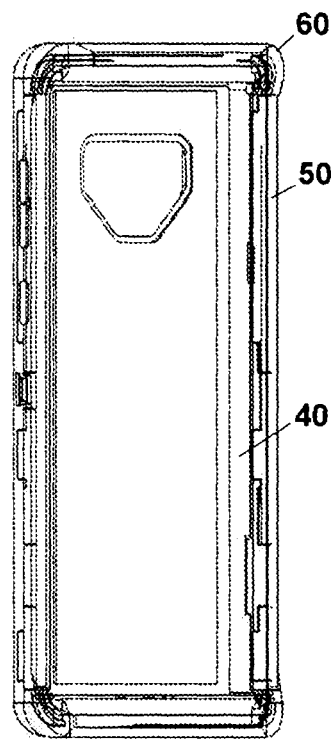
FIG. 6 is a perspective view of the soft outer case coupled to the hard inner case for the mobile device, while in use, according to the prior art.

Referring to FIG. 6, the combined assembly of the front half of hard inner case 20, back half of hard inner case 30 and the soft outer case 50 illustrates the protective mobile device case 60. The multiple layers and materials form a system that has a different net thermal conductivity at each point along the outer surface due to the varying geometries and material thicknesses within the assembly. It should be noted that protective mobile device case 60 can be constructed with any number of layers and of any type of material.

Figure 7:
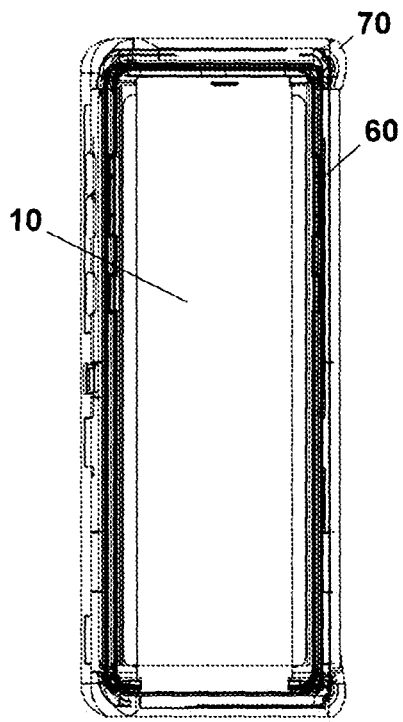
FIG. 7 is a perspective view of the mobile device surrounded by the soft outer case coupled to the hard inner case, while it is in use, according to prior art.

Referring to FIG. 7, the combined assembly of the front half of hard inner case 20, back half of hard inner case 30, the soft outer case 50, and mobile device 10 form a protected mobile device 70 where mobile device 10 is within the protective mobile device case 60. The mobile device 10 geometry and design elements tend to be unique with each subsequent generation of mobile device 10 so the net geometry of the protective mobile device case 60 will vary also. As such the thermal effect of the protective mobile device case 60 on critical elements such as a battery and a CPU/GPU within mobile device 10 can vary between mobile device 10 models and generations. One way to gauge the effect of having a protective mobile device case 60 attached to mobile device 10 is to fix environmental conditions such as temperature and humidity and stress test (Antutu) the CPU/GPU 142 in the mobile device 10 by running software that cycles the mobile device 10 to maximum CPU/GPU 142 usage and monitoring the CPU/GPU 142 temperature and battery 141 temperature during those cycles. By comparing the maximum CPU/GPU 142 and the battery 141 temperatures while the mobile device 10 has no protective mobile device case 60 to the maximum CPU/GPU 142 and battery 141 temperatures when the mobile device 10 is encased in the protective mobile device case 60 you can establish for that particular protective mobile device case 60 and mobile device 10 the net thermal effects. The Peak temperatures in mobile device 10 at an ambient room temperature of 76° F. without protective mobile device case 60 are 88° F. for the battery 141 and 126° F. for the CPU/GPU 142. The Peak temperatures in mobile device 10 at an ambient room temperature of 76° F. with protective mobile device case 60 are 93° F. for the battery 141 and 129° F. for the CPU/GPU 142. The protective mobile device case 60 is a net thermal insulator causing a 5-degree rise in battery temperature and 3-degree rise in CPU temperature during these same test conditions. The thermal insulation is not really a problem at ambient temperatures around 76° F. but in vehicles where temperatures in the vehicle can reach 120° F. the thermal insulation facilitates driving the mobile device 10 into thermal shutdown mode much quicker with higher net operating temperatures.

Figure 8:
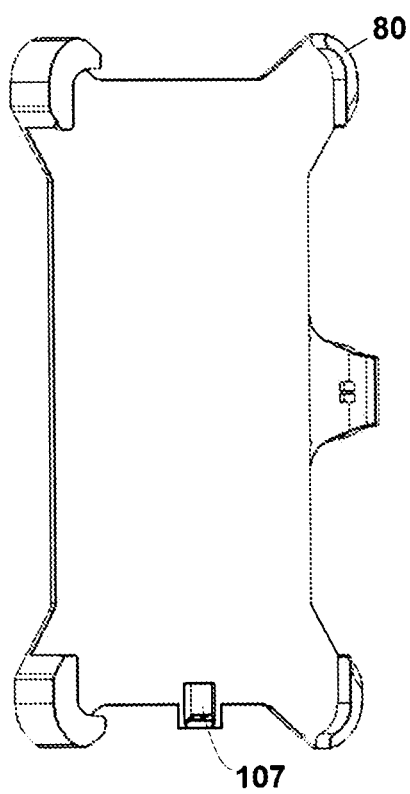
FIG. 8 is a perspective view of a cradle/dock that holds the mobile device in a case, while in use, according to the prior art.
Figure 9:
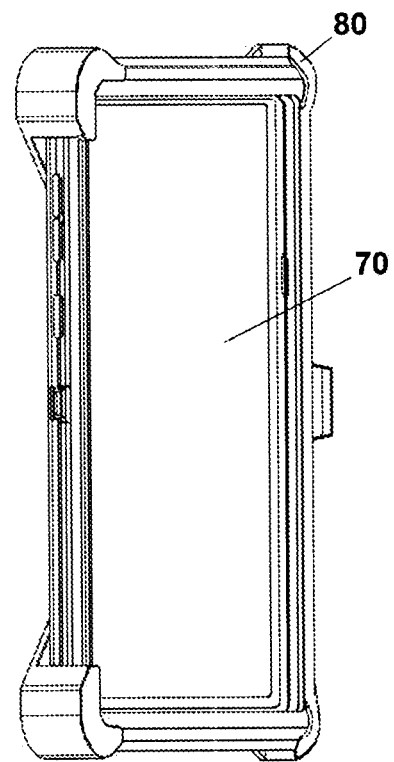
FIG. 9 is a perspective view of the mobile device in the case nested in the cradle/dock, while in use, according to the prior art.

Referring to FIGS. 8 and 9, the mobile device cradle/dock 80 and protected mobile device 70 in the mobile device cradle/dock 80 are illustrated. The Protected mobile device 70 can slide into, rotate into, or be clipped into the mobile device cradle/dock 80 where the attaching action is featured in well known smartphone cradles or docks such as the commercially available, Strike Alpha Cradle, OtterBox Defender, or Ram Mount GDS dock. The mobile device cradle/dock 80 can be attached to a belt clip, desktop stand, or vehicle mount to hold, use or store a protected mobile device 70. The mobile device cradle/dock 80 is typically fabricated from polycarbonate and acts as a further thermal insulator for heat transfer. The mobile device cradle/dock 80 may be a cradle only or may be a dock which has an electrical interface to external circuitry such as an integrated USB C connector 107 which mates with a USB C phone connector 143 at the base of the mobile device 10.

Figure 10:
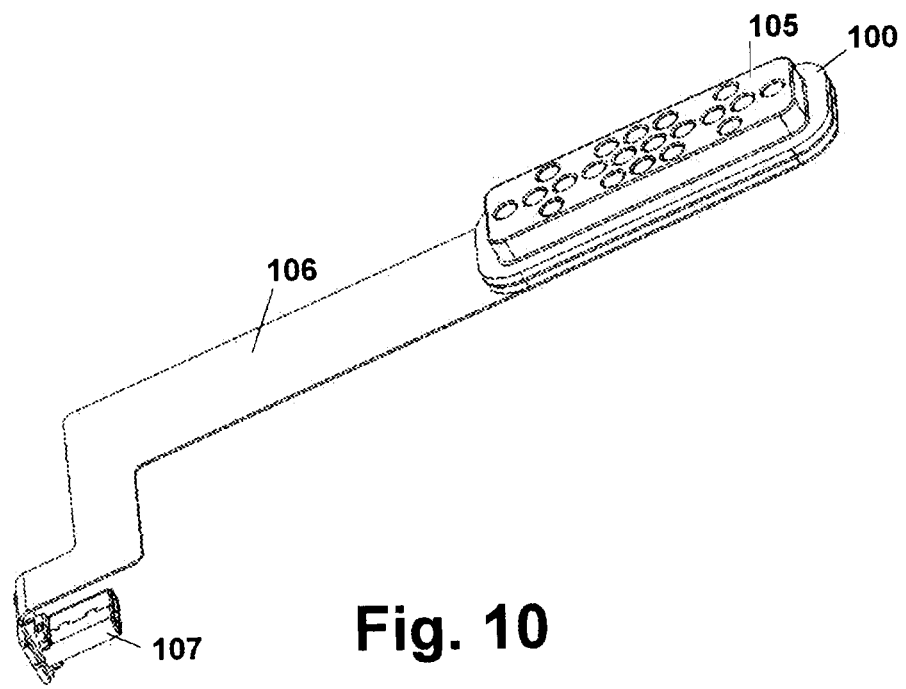
FIG. 10 is a perspective view of the USB type C connector attached to a flex circuit connected to the female half of a pogo pin connector, while in use, according to the present invention.
Figure 11:
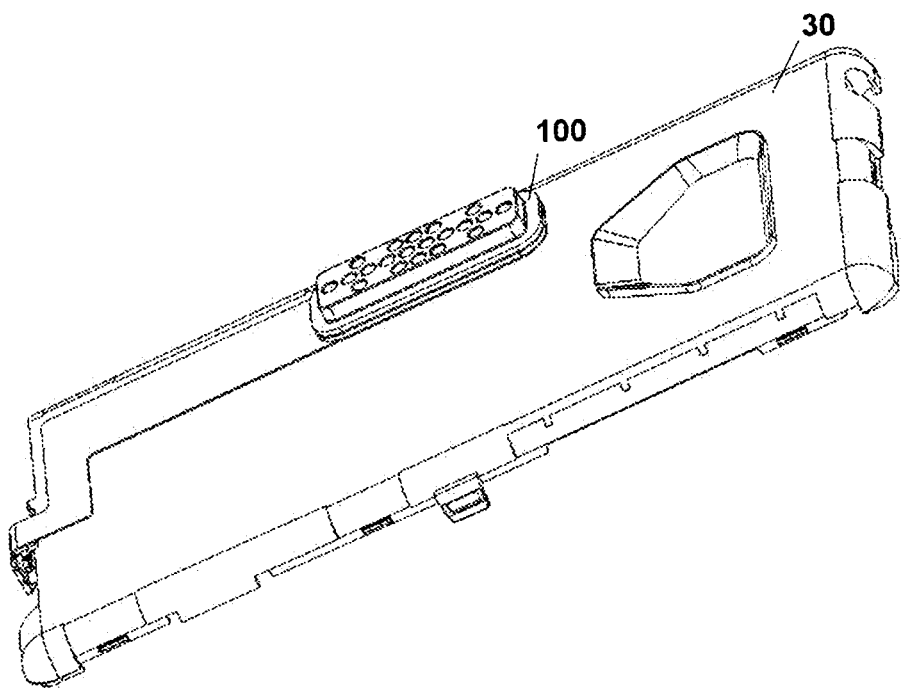
FIG. 11 is a perspective view of the back half of the hard inner case attached to the USB type C connector, flex circuit, and female half of the pogo pin connector, while in use, according to the present invention.
Figure 12:
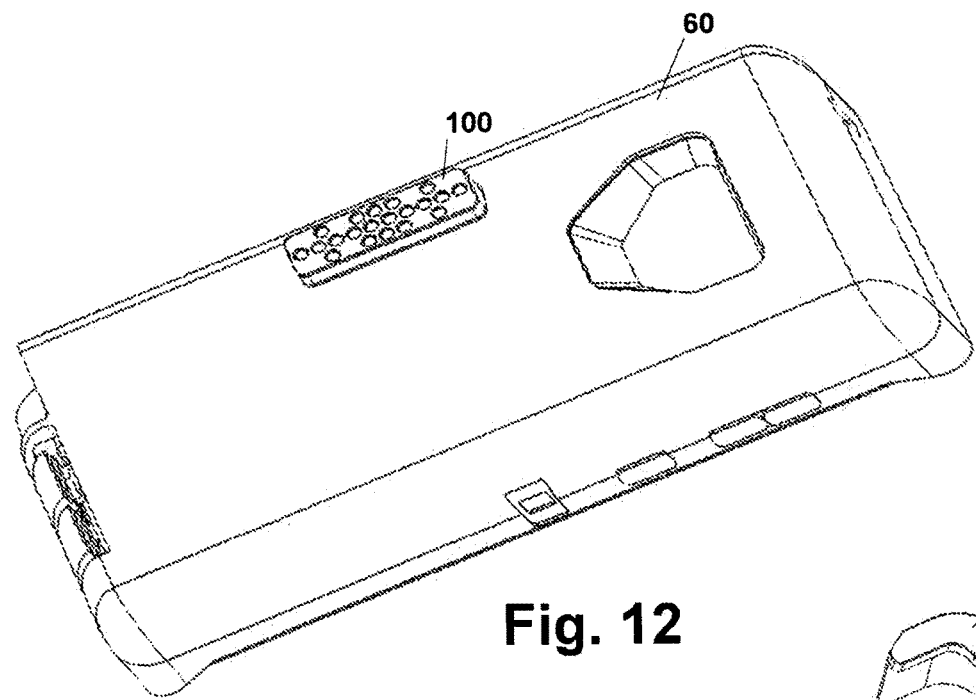
FIG. 12 is a perspective view of the soft outer case, attached to the back half of the hard inner case, USB type C connector, flex circuit, and female half of the pogo pin connector, while it is in use, according to the present invention.

Referring to FIG. 10, a pogo pin interface assembly 100 is illustrated. The pogo pin interface assembly 100 can be made with various constructions known in the art, however as illustrated here it is comprised of a USB C connector 107 routed to a female pogo pin block 105 via a flexible circuit board 106. FIG. 11 shows the pogo pin interface assembly 100 attached on to the back half of hard inner case 30, and in FIG. 12 it shows the pogo pin interface assembly 100 is shown protruding through the surface when the protective mobile device case 60 is assembled. When mobile device 10 is inserted into protective mobile device case 60 having pogo pin interface assembly 100, the USB C connector 107 mates with a USB C mobile device connector 143 at the base of the mobile device 10. Pogo pin interface assembly 100 is then connected to mobile device 10 and makes it dockable.

Figure 13:
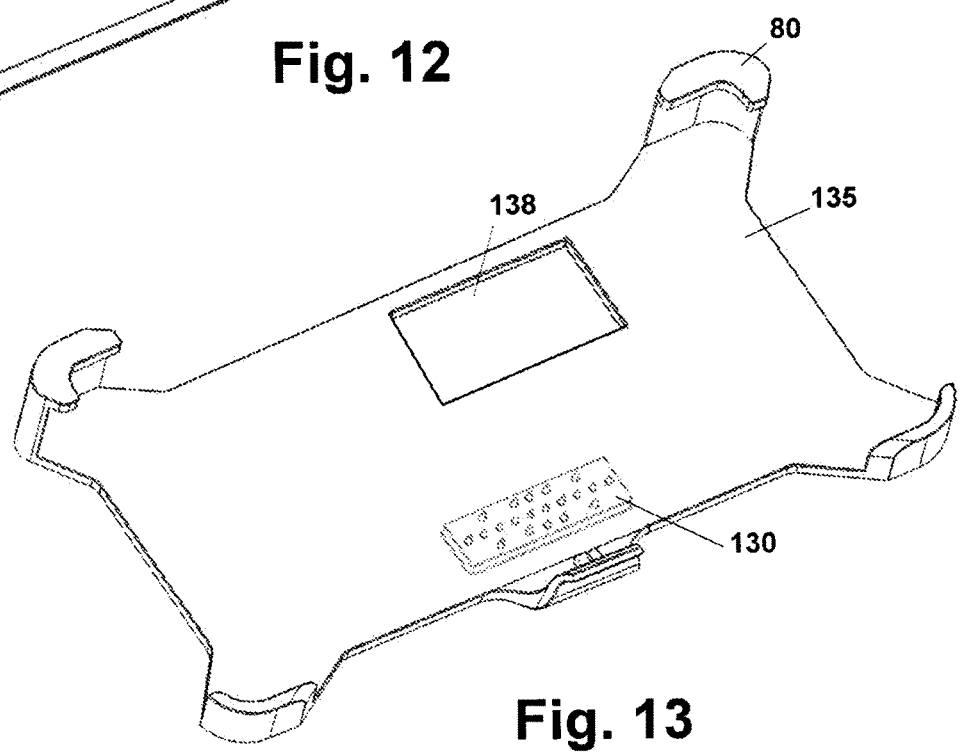
FIG. 13 is a perspective view of the cradle/dock with the male half of the pogo pin connector that mates with the female half of the pogo pin connector in FIG. 12, while in use, according to the present invention.

In FIG. 13 the mobile device cradle/dock 80 is integrated with a female pogo pin interface assembly 130 that can be hard wired to a USB hub or any other USB interface or cable known in the art. The mobile device cradle/dock 80 contains an opening 138 that can be used for access to cool the mobile device 10 in subsequent embodiments. This effectively converts the cradle/dock 80 into docking assembly 135. The protective mobile device case 60 illustrated in FIG. 12 when locked into docking assembly 135 connects a mobile device 10 within the docking assembly 135 to whatever USB device is connected to female pogo pin interface assembly 130. The point of using docking assembly 135 over connecting via a cable to the USB C mobile device connector 143 serves two purposes. The first are pogo pins are rated for a longer service life in terms of number of connections and disconnections, and the second is pogo pins with a large pitch pins are easier to align which makes them easier for blind connections.

Figure 14:
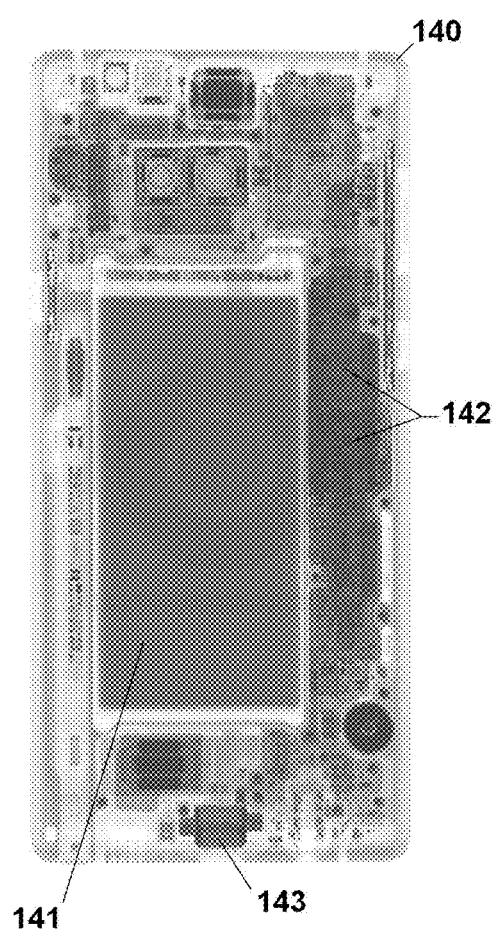
FIG. 14 is an x-ray image of a mobile device, while it is in use, according to the present invention.
Figure 15:
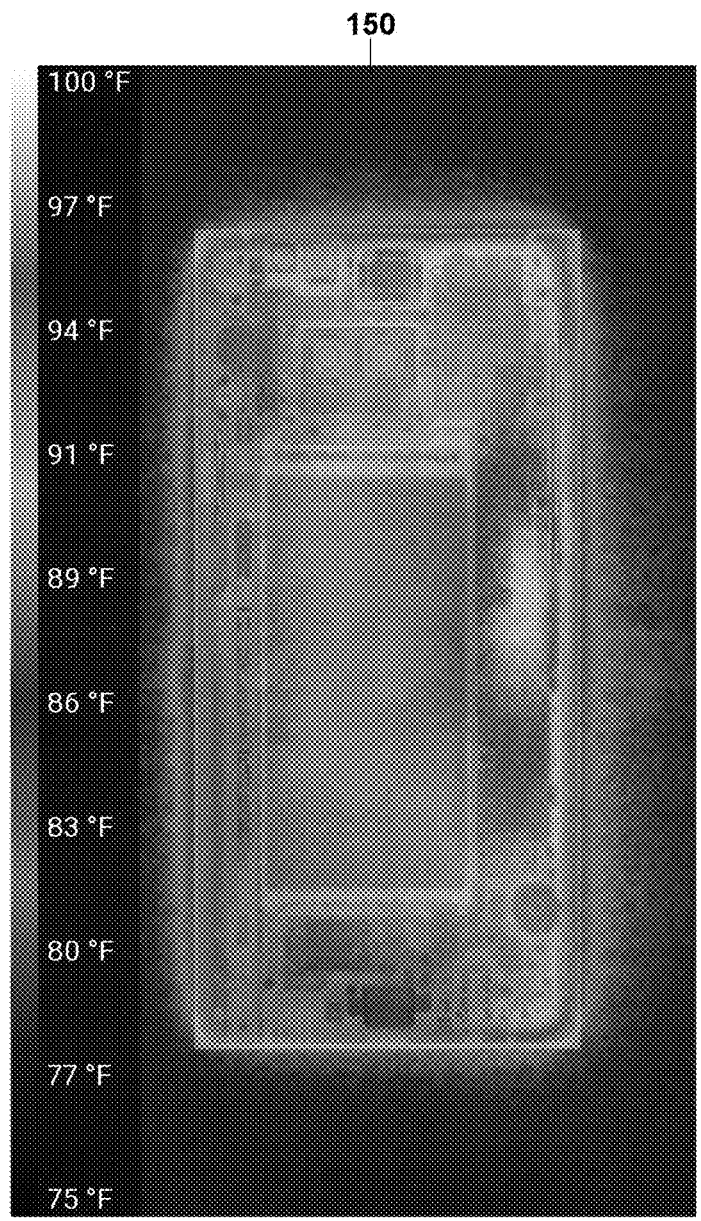
FIG. 15 is a thermal image of a mobile device being stress tested, while in use, according to the present invention.
Figure 16:
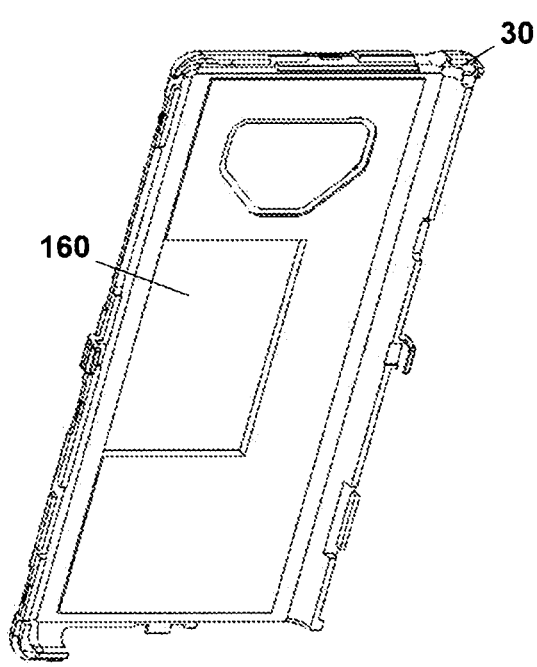
FIG. 16 is a perspective view of the back half of the hard inner case with clearance hole for thermal interface material, while in use, according to the present invention.
Figure 17:
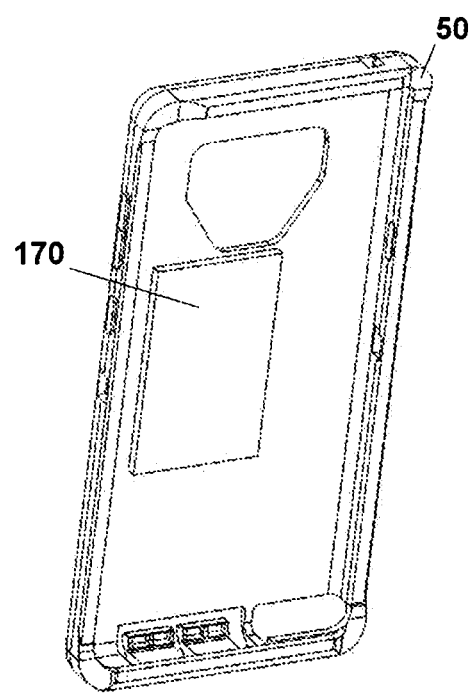
FIG. 17 is a perspective view of the soft outer case with a double shot protrusion of thermal interface material, while in use, according to the present invention.

Referring to FIG. 14, the x-ray image 140 shows component locations within the mobile device 10. Of key importance are the battery 141, the CPU/GPU 142 and the USB C mobile device connector 143. The battery 141 and the CPU/GPU 142 produce heat which must be dissipated and the x-ray image 140 shows their locations relative to heat conducting surfaces in the mobile device 10. In FIG. 15, there is a thermal image 150 of the mobile device 10 during a CPU/GPU 142 stress test with the x-ray image 140 superimposed on to the thermal image 150. It becomes apparent that the surface of the mobile device 10 adjacent to the CPU/GPU 142 is where most of the heat is dissipated. Likewise while the battery 141 charges and discharges rapidly, the surface directly above the battery 141 dissipates the most heat. In establishing a method to optimize cooling or heating a mobile device 10, an important step will be thermal imaging of the mobile device 10 during high heat producing cycles. The thermal image 150 establishes the locations and geometry where application of active heating/cooling will benefit the most. The energy cost in terms of wattage goes up linearly with area when one uses technology like peltier to heat or cool the mobile device 10. To optimize the heating/cooling energy usage, the active footprint of the peltier is applied to the smallest effective area that will protect the critical components that generate the most heat. The peltier device is a semiconductor based component that requires a thermal coupling material between it and the device being cooled to maximize heat transfer. In the current art, a protected mobile device 70 is encased with thermal insulators that limit the flow of heat away from the critical areas identified from the thermal images 150 above. In FIGS. 16 and 17 a cutout 160 in the back half of hard inner case 30 and a cutout 170 in the soft outer case 50 are illustrated. The Cutout 160 and the cutout 170 remove the insulating materials from the protective mobile device case 60. The cutout 160 and cutout 170 are a size, shape, and location to effectively transfer heat to/from the CPU/GPU 142 and the battery 141.

Figure 18:
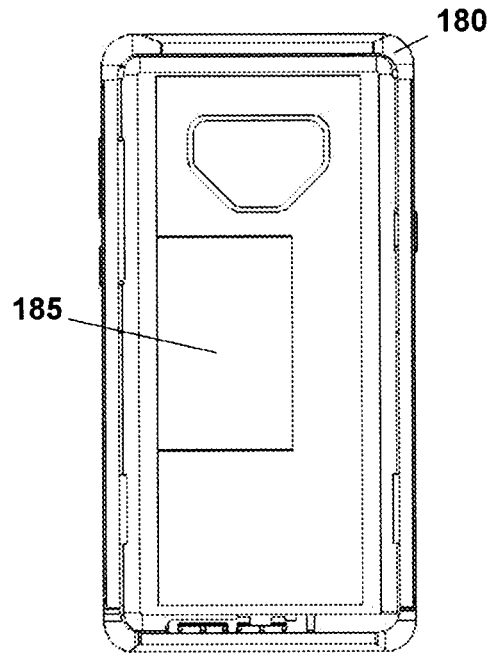
FIG. 18 is a perspective view of the soft outer case with a double shot protrusion of thermal interface material coupled to the back half of the hard inner case with protrusion of thermal interface material flush with inner surface, while in use, according to the present invention.

In FIG. 18, a thermal interface material 185 is inserted into cutout 160 and cutout 170 of protected mobile device 70 and with the addition of thermal interface material 185 becomes thermally a protected mobile device 180. The thermal interface material 185 can be permanently attached to either the back half of hard inner case 30 or the soft outer case 50 using an adhesive, geometrically captured between layers or attached using any other means known in the art. The thermal interface material 185 for example could be GS7014 made by General Silicone of Taiwan. The GS7014 material is compliant that can be formed to any thickness and size and for this example would be the combined thickness of the back half of hard inner case 30 and a the soft outer case 50 plus perhaps 10 mils to form an interference fit with the mobile device 10 and the mobile device cradle/dock 80 when nested. The GS7014 material has a thermal conductivity of 1.4 W/(m K) and is 7× more conductive then the polycarbonate back half of hard inner case 30 and is a little more thermally conductive then gorilla glass five making heat transfer away to/from the back of mobile device 10 very efficient whether transfer is active or passive.

In summary the best procedure for optimizing the protective mobile device case 60 is the following: Step 1, identify the thermal conductivity of the material(s) comprising the exterior surfaces of the mobile device. Step 2, identify a location on the exterior surfaces where thermal dissipation of heat from internal components is concentrated. Step 3, select or design a protective case that detachably attaches to the mobile device for mechanical and environmental protection. Step 4, excise a region of the protective case where materials have lower thermal conductivity than the said identified thermal conductivity of the exterior surface on the mobile device where heat dissipation is concentrated. Step 5, insert a replacement cross section of a thermal interface material into said region of said protective case where the replacement cross section has a higher thermal conductivity then the adjacent corresponding surfaces of the mobile device.

Figures 19, 20:
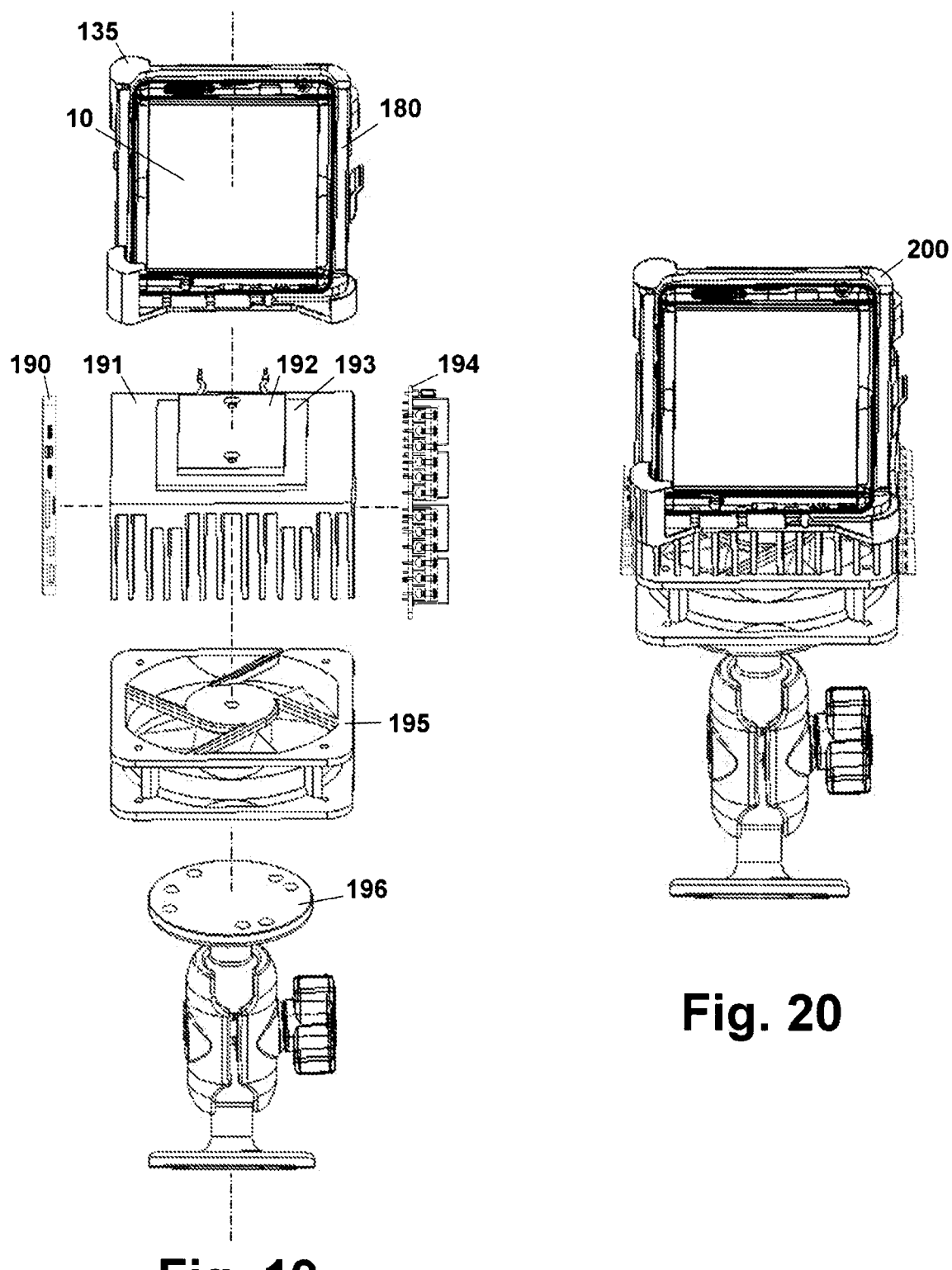
FIG. 19 is an exploded diagram of a mount, cooling fan, heat sink, peltier device, cradle/dock, case and mobile device, while in use, according to the present invention.
FIG. 20 is a perspective view of an assembly comprising a mount, cooling fan, heat sink, peltier device, cradle/dock, case and mobile device, while in use, according to the present invention.

Referring to FIG. 19 and FIG. 20 is an expanded and standard view of an active heating or cooling mobile device dock assembly 200 for mobile device 10. Docking assembly 135 is mated with thermally protected mobile device 180. The bottom surface of the docking assembly 135 is fastened to a heat sink 191 that has fastened to it a heating/cooling peltier device 193 sandwiched between a heating or cooling plate 192 that can be typically metallic and a heat sink 191. There can be a thermally conductive paste or other material known in the art between the heating or cooling plate 192, the heating/cooling peltier device 193, and the heat sink 191 to facilitate thermal coupling. An opening 138 in docking assembly 135 allows heating or cooling plate 192 to be in intimate contact with thermal interface material 185 of the thermally protected mobile device 180. A cooling fan 195 blows air on to the fins of heat sink 191 to facilitate heat transfer to the ambient environment. A mount 196, such as a RAM-B-101U universal double ball mount with two round plates from National Products Inc. of Seattle, Wash., is attached to docking assembly 135 via a round top plate and a vehicle or cart via a round bottom plate. Any mount 196 known in the art can be used as is appropriate for the application. The mobile device 10 is coupled via docking assembly 135 to external circuitry comprising an integral HDMI display port with USB hub 190. The integral HDMI display port with USB hub 190 that is well known in the art can have any configuration of display ports, USB ports, Ethernet ports, audio ports, or any other I/O and is generally capable of charging an attached mobile device 10. The intent of the desktop mode utility is to use mobile device 10 as a desktop style computing system with full size display and keyboard with mouse, touchpad, or touchscreen for input. The display, keyboard, mouse, touchpad, touchscreen and other peripherals are interfaced to the mobile device 10 via the integral HDMI display port with USB hub 190 generally powered up by an external power source such as a vehicle battery. The vehicle battery can be protected by circuitry well known in the art where the vehicle battery is monitored for a low voltage threshold such as 11V and cuts off power to all mobile device 10 related external circuitry before the battery voltage breaches that threshold thereby preventing having a dead battery in the vehicle. Ideally all external circuitry only draws power and operates when any mobile device 10 is docked to conserve the vehicle battery power. The fan/peltier controller 194 is also interfaced to the mobile device 10 via the integral HDMI display port with USB hub 190. The fan/peltier controller 194 is simply a digital I/O board with sufficient channels to enable/disable the cooling fan 195, set the polarity of the heating/cooling peltier device 193 to configure cooling or heating mode, then enable/disable the heating or cooling peltier device 193. Peltier controllers generally use temperature feedback from at least one thermocouple attached externally to the device being cooled or heated to cycle heating and cooling modes based on preset temperatures in the controller. The mobile device 10 has thermal sensors internally that can monitor the CPU/GPU 142, battery 141 and other temperatures. Software within the mobile device 10 can monitor those internal temperatures, compare them to set thresholds for when the mobile device 10 components are too hot or too cold, and communicate to the fan/peltier controller 194 to trigger the appropriate switching I/O to cycle the heating/cooling peltier device 193. Once the internal temperatures of the mobile device 10 components are back to a safe operating temperature, the software can communicate to the fan/peltier controller 194 to trigger the appropriate O/O to disable and reset the heating/cooling peltier device 193. By using temperatures of the components most sensitive to heat damage instead of external device temperatures the components of mobile device 10 are less likely to degrade and fail from temperature extremes. Ideally software on mobile device 10 actively runs exclusively and is triggered to run when the mobile device 10 is docked to conserve the mobile device 10 computing resources. When the mobile device 10 is inoperable because it is out of its nominal operating temperature range, manual switches on the active heating or cooling mobile device dock assembly 200 will be needed to turn on the peltier heating or cooling to return it to a nominal operating temperature range.

It will thus be seen that the needs set forth above, and those made apparent from the preceding descriptions, are effectively attained and since certain changes may be made in the above construction without departing from the spirit and scope of the invention, it is intended that all matter contained in the above description or shown in the accompanying drawings, shall be interpreted as illustrative and not in a limiting sense.

It is also to be understood that the following claims are intended to cover all generic and specific features of the invention herein described and all statements of scope of the invention, which as a matter of language, might be said to fall there between.

What is claimed is:

The invention claimed is:

1. An apparatus comprising a thermally optimized protective case that detachably attaches around a mobile device for temperature regulation and heat transfer to and from the mobile device, wherein:
   at least one region of mobile device protective case has thermally insulating materials removed and replaced with a thermally conductive material;
   said region corresponds to at least one location on the external surface of the mobile device for the thermal dissipation of heat to and from at least one of CPU, a GPU, battery, or other thermally sensitive element within the mobile device;
   said at least one region of mobile device protective case containing said thermally conductive material provides a contiguous thermally conductive path from the external surface of the mobile device through the mobile device protective case and through an external thermally conductive medium that will source or sink heat wherein the cross section of the external thermally conductive medium is the same as the cross section of the thermally conductive material within said mobile device protective case which is coupled to it.

2. The thermally optimized protective case according to claim 1, wherein said medium transfers heat to and from said mobile device though the thermally optimized protective case passively.

3. The thermally optimized protective case according to claim 1, wherein said medium transfers heat to and from said mobile device through the thermally optimized protective case to an actively controlled heat pump within a dock.

4. The thermally optimized protective case according to claim 3, wherein said active heat transfer regulates the temperature of the mobile device into a nominal operating range.

5. The thermally optimized protective case according to claim 1, wherein said at least one region of mobile device protective case is the size and shape of a heating or cooling plate coupled to a peltier device within a dock for generating active heating and cooling.

6. The thermally optimized protective case according to claim 1, wherein said thermally conductive material is a compliant thermal interface material.

7. The thermally optimized protective case according to claim 6, wherein the thermal interface material is attached to the thermally optimized protective case with a thermally conductive adhesive.

8. The thermally optimized protective case according to claim 6, wherein the thermal interface material is geometrically captured between two or more layers of the thermally optimized protective case.

9. The thermally optimized protective case according to claim 1, wherein said thermally optimized protective case is comprised of a single layer that is a hard impact resistant plastic.

10. The thermally optimized protective case according to claim 1, wherein said thermally optimized protective case is comprised of a single layer that is a compliant soft elastomer.

11. The thermally optimized protective case according to claim 1, wherein said thermally optimized protective case is comprised of two layers where one layer is a hard impact resistant plastic and another layer is a compliant soft elastomer.

12. The thermally optimized protective case according to claim 1, wherein said thermally optimized protective case containing a mobile device can be docked.

13. The thermally optimized protective case according to claim 1, wherein said thermally optimized protective case containing the mobile device can be undocked.

14. The thermally optimized protective case according to claim 13, wherein said thermally optimized protective case containing the mobile device when docked can be actively heated and cooled and is passively heated and cooled when undocked.

15. A method of optimizing thermal transfer to and from a mobile device, comprising the steps of:
   identifying a numeric value for a thermal conductivity of the material(s) comprising the exterior surfaces of the mobile device;
   identifying a location on said exterior surfaces where thermal dissipation of heat from internal components is concentrated;
   selecting or designing a protective case that detachably attaches to the mobile device for mechanical and environmental protection;
   excising a region having an equivalent cross section to an external thermally conductive medium that will sink or source heat from said mobile device, said region excised from of the protective case where materials have a lower numeric value for thermal conductivity than the said identified numeric thermal conductivity of the exterior surface on the mobile device where heat dissipation is concentrated;
   inserting a replacement cross section of a thermal interface material into said region of said protective case where the replacement cross section has a higher numeric value for the thermal conductivity then the adjacent corresponding surfaces of the mobile device.

16. The method according to claim 15, wherein the protective case comprises one or more layers of materials, material thickness, and hardness where all layers in said region are replaced with a cross section of thermal interface material with a net thickness of all the layers removed.

17. The method according to claim 15, wherein thermal imaging is a technique used to identify a location on said surfaces where thermal dissipation of heat from internal components is concentrated.

18. The method according to claim 15, wherein thermal dissipation of heat from internal components includes heat transferred from at least one of a CPU, a GPU, a battery and associated heat pipes.

* * * * *